United States Patent
Ahn

(10) Patent No.: US 9,374,082 B2
(45) Date of Patent: Jun. 21, 2016

(54) CLOCK CONTROL DEVICE OF CONTROLLING CLOCK STABLE TIME BASED ON OPERATIONAL CONDITION, SEMICONDUCTOR DEVICE INCLUDING THE SAME AND CLOCK CONTROL METHOD

(71) Applicant: SAMSUNG ELECTRONICS CO., LTD., Suwon-si (KR)

(72) Inventor: Ji-Yong Ahn, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 266 days.

(21) Appl. No.: 13/934,354

(22) Filed: Jul. 3, 2013

(65) Prior Publication Data

US 2014/0084965 A1 Mar. 27, 2014

(30) Foreign Application Priority Data

Sep. 21, 2012 (KR) .................. 10-2012-0105227

(51) Int. Cl.
| | | |
|---|---|---|
| *G06F 1/00* | (2006.01) | |
| *H03K 17/30* | (2006.01) | |
| *G06F 1/04* | (2006.01) | |
| *G06F 1/32* | (2006.01) | |

(52) U.S. Cl.
CPC *H03K 17/30* (2013.01); *G06F 1/04* (2013.01); *G06F 1/3206* (2013.01)

(58) Field of Classification Search
CPC ............. G06F 1/105; G06F 1/12; G06F 1/14; H03K 17/30
USPC .......................................................... 713/500
See application file for complete search history.

(56) References Cited

U.S. PATENT DOCUMENTS

| | | | | |
|---|---|---|---|---|
| 5,243,637 A | * | 9/1993 | Flaherty et al. | .................. 377/95 |
| 5,613,235 A | * | 3/1997 | Kivari | .................. H04B 1/1615 |
| | | | | 331/14 |
| 7,126,434 B2 | | 10/2006 | Lee | |
| 7,944,908 B2 | * | 5/2011 | Lee | ........................ H04L 1/0014 |
| | | | | 370/351 |
| 2005/0049729 A1 | | 3/2005 | Culbert et al. | |
| 2007/0211010 A1 | * | 9/2007 | Lin | ...................... G09G 3/2092 |
| | | | | 345/99 |
| 2008/0031303 A1 | * | 2/2008 | Bowden et al. | ............... 374/163 |
| 2008/0303601 A1 | * | 12/2008 | Young | .............................. 331/66 |

FOREIGN PATENT DOCUMENTS

| | | |
|---|---|---|
| JP | 5-35359 A | 2/1993 |
| JP | 5-259825 A | 10/1993 |
| JP | 5-314278 A | 11/1993 |
| JP | 6-261100 A | 9/1994 |
| JP | 2000-101347 A | 4/2000 |

(Continued)

*Primary Examiner* — Mohammed Rehman
(74) *Attorney, Agent, or Firm* — Sughrue Mion, PLLC

(57) ABSTRACT

A clock control device and method are provided. The clock control device includes a stable time controller which receives an operational condition and generates an expiration counting value based on the operational condition; a stable time counter which receives the expiration counting value and activates a clock gating enable signal after a count value of the stable time counter is equal to the expiration counting value; a clock gating cell which transmits a clock signal after receiving the clock gating enable signal; and an oscillator which generates an oscillator clock signal and transmits the oscillator clock signal to the clock gating cell and the stable time counter.

15 Claims, 12 Drawing Sheets

(56) References Cited

FOREIGN PATENT DOCUMENTS

| | | | |
|---|---|---|---|
| JP | 2002-91940 A | 3/2002 |
| JP | 2006-285823 A | 10/2006 |
| JP | 2011-248595 A | 12/2011 |
| KR | 2000-0038479 A | 7/2000 |

* cited by examiner

FIG. 8

| ECV<br>(EXPIRE<br>COUNTER VALUE) | CN(COUNTING NUMBER) | | | | C_EN |
|---|---|---|---|---|---|
| 0001 | 0000 | 0000 | 0000 | 0001 | 0 |
| 0001 | 0000 | 0000 | 0000 | 0010 | 0 |
| 0001 | 0000 | 0000 | 0000 | 0011 | 0 |
| 0001 | 0000 | 0000 | 0000 | 0100 | 0 |
| ⋮ | ⋮ | | | | ⋮ |
| 0001 | 0000 | 1111 | 1111 | 1111 | 0 |
| 0001 | 0001 | 0000 | 0000 | 0001 | 1 |
| 0001 | 0001 | 0000 | 0000 | 0010 | 1 |
| 0001 | 0001 | 0000 | 0000 | 0011 | 1 |
| 0001 | 0001 | 0000 | 0000 | 0100 | 1 |

US 9,374,082 B2

CLOCK CONTROL DEVICE OF CONTROLLING CLOCK STABLE TIME BASED ON OPERATIONAL CONDITION, SEMICONDUCTOR DEVICE INCLUDING THE SAME AND CLOCK CONTROL METHOD

CROSS-REFERENCE TO RELATED APPLICATION

This application claims priority from Korean Patent Application No. 10-2012-0105227, filed on Sep. 21, 2012 in the Korean Intellectual Property Office, the entire disclosure of which is hereby incorporated by reference.

BACKGROUND

1. Field

Apparatuses and methods consistent with exemplary embodiments relate to an electronic device having a gating operational clock system, and more particularly a gating operational clock system which can control stable time needed for supplying stable clock to a system.

2. Description of the Related Art

With the increasing of need of SoC (System on a Chip) products, low power SOC product design with high performance and high integration is becoming important. More particularly, less power consumption is a key issue for mobile devices which are operated by a battery.

Generally, mobile devices are in an inactive mode for larger portion of time than they are in an active mode. Accordingly, it is possible to consume less power by turning off certain functions or parts of the mobile devices in an inactive mode.

However, it takes a period of time, referred to as a wake-up time, to change the operation mode of a mobile terminal from an inactive mode to an active mode. The stable time for supplying a stable operational clock by an oscillator takes a large portion of the wake-up time.

SUMMARY

According to an aspect of an exemplary embodiment, a clock control device is provided. The clock control device includes: a stable time controller which receives an operational condition and generates an expiration counting value based on the operational condition; a stable time counter which receives the expiration counting value and activates a clock gating enable signal after a count value of the stable time counter is equal to the expiration counting value; a clock gating cell which transmits a clock signal after receiving the clock gating enable signal; and an oscillator which generates an oscillator clock signal and transmits the oscillator clock signal to the clock gating cell and the stable time counter.

The oscillator may generate the oscillator clock signal in response to receiving a power control signal.

The operational condition may be at least one from among temperature and voltage.

The clock signal and the oscillator clock signal may be the same when the stable time counter receives the clock gating enable signal.

The stable time counter may count the count value when the stable time counter receives the oscillator clock signal.

The stable time controller may include a condition table which stores a plurality of stable times that correspond to a plurality of operational conditions; and a controller which receives the operational condition and determines a stable time corresponding to the received operational condition from among the plurality of stable times stored in the condition table and generates the expiration counting value that corresponds to the determined stable time.

The clock control device may also include a hardware performance monitor which monitors an environment of the oscillator and generates the operational condition based on the environment of the oscillator and transmits the operational condition to the stable time controller.

The hardware performance monitor may generate the operational condition by calculating at least one from among an average instruction execution time, a frequency of appearance of instructions, and an equipment usage rate of a system containing the oscillator.

The stable time controller may include a condition table which stores a plurality of stable times that correspond to a plurality of operational conditions, and a controller which determines a stable time corresponding to the operational condition received from the hardware performance monitor from among a plurality of stable times in the condition table and generates the expiration counting value that corresponds to the determined stable time.

The stable time counter may include: a register which stores the expiration counting value received from the stable time controller; a counter which generates the count value based on clock periods of the oscillator clock signal; and a comparator which compares the counting value and the expiration counting value and activates the clock gating enable signal based on the comparison.

The stable time counter may include: a register which stores the expiration counting value received from the stable time controller; and a variable delay device which receives the oscillator clock signal and delays the activation of the clock gating enable signal for a predetermined number of clock periods of the oscillator clock signal based on the expiration counting value.

According to an aspect of another exemplary embodiment, a clock control method is provided, the method including: receiving a wake-up signal and an operational condition; generating an oscillator clock signal after receiving the wake-up signal; determining a stable time of the oscillator clock signal based on the operational condition; and activating a clock gating enable signal to supply the oscillator clock signal when the stable time is reached, wherein the oscillator clock signal is stable when the stable time is reached.

The operational condition may be at least one from among power and voltage temperature.

Thee stable time is a clock count number and the activating a clock gating enable signal may include: comparing the stable time to a counting number based clock periods of the oscillator clock signal; and activating the clock gating enable signal based on the comparison.

The activating a clock gating enable signal may include: delaying the activating of the clock gating enable signal for a predetermined number of clock periods of the oscillator clock signal based on the stable time.

According to an aspect of still another exemplary embodiment, a semiconductor device is provided. The semiconductor device includes: the clock control device of claim 1; a logic circuit which receives the clock signal from the clock control device; and a power management unit which controls power supply of the semiconductor device.

The oscillator may generate the oscillator clock signal in response to receiving a power control signal from the power management unit, and the stable time counter may count the count value when the stable time counter receives the oscillator clock signal from the oscillator.

The semiconductor device may further include a hardware performance monitor which monitors an environment of the oscillator, generates the operational condition based on the environment of the oscillator and transmits the operational condition to the stable time controller.

BRIEF DESCRIPTION OF THE FIGURES

The above and other aspects will become apparent from the following description with reference to the following figures, wherein like reference numerals refer to like parts throughout the various figures unless otherwise specified, and wherein:

FIG. 8 is a table illustrating a stable counting signal, a counting value, and a clock gating signal in a stable time counter in FIG. 7 according to an aspect of an exemplary embodiment.

DETAILED DESCRIPTION OF EXEMPLARY EMBODIMENTS

Figure 1:
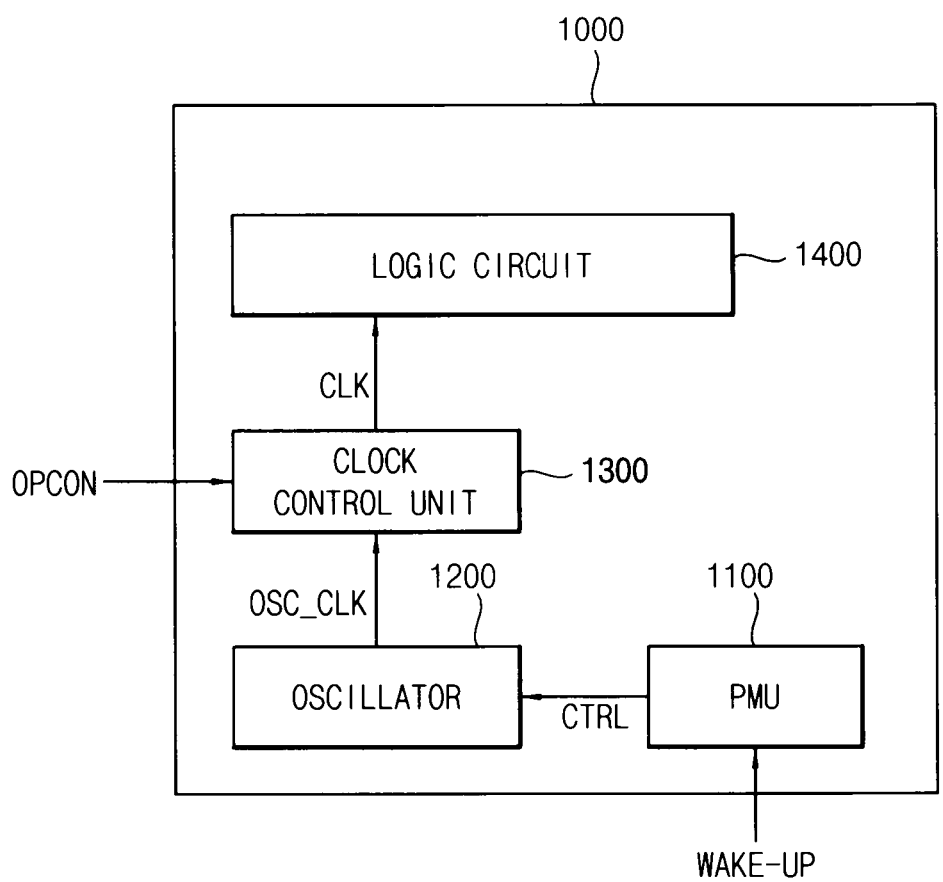
FIG. 1 is a semiconductor device unit according to an exemplary embodiment.

Exemplary embodiments will be described in detail with reference to the accompanying drawings. Exemplary embodiments, however, may be embodied in various different forms, and should not be construed as being limited only to the illustrated exemplary embodiments. Rather, these exemplary embodiments are provided as examples so that this disclosure will be thorough and complete, and will fully convey the concepts of the disclosure to those skilled in the art. Accordingly, known processes, elements, and techniques are not described with respect to some of the exemplary embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first," "second," "third," etc., may be used herein to describe various elements, components, regions, layers, and/or sections, these elements, components, regions, layers, and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular exemplary embodiments only and is not intended to be limiting. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a semiconductor device according to an exemplary embodiment. Referring to FIG. 1, the semiconductor device 1000 may include a power management unit (PMU)

1100 (e.g., a power management device), an oscillator 1200, a clock control unit 1300 (e.g., a clock control device) and a logic circuit 1400.

The PMU 1100 may control the power supply of the semiconductor device 1000. For example, when the semiconductor device 1000 enters an inactive mode, the PMU 1100 may cut power supply to the semiconductor device 1000 by shutting off a power control integrated circuit (not shown). The PMU 1100 may consume power continuously. However, power consumed at the PMU 1100 is very small compared to power consumed by the whole semiconductor device 1000. Through which power consumption in the semiconductor device 1000 can be dramatically reduced in the inactive mode. The PMU 1100 may transmit a power control signal (CTRL) in response to a wake-up signal supplied in the inactive mode.

The oscillator 1200 may generate a certain frequency and supply an active clock (CLK) to the logic circuit 1400 through the clock control unit 1300. A crystal oscillator uses the mechanical resonance of a vibrating crystal of piezoelectric material to create an electrical signal with a very precise frequency.

When the power is supplied to the oscillator 1200, an oscillation may begin and over time clock oscillation enters a stable state from an unstable state. The clock control unit 1300 may supply a stable active mode clock to the logic circuit 1400 after the clock oscillation becomes stable. The clock control unit 1300 may change stable time, which is the time from the that the oscillator gets power to the time of generating a stable active mode clock, according to an operation condition OPCON. To achieve this, the clock control unit 1300 may receive data for setting OPCON from an external source.

Figure 2:
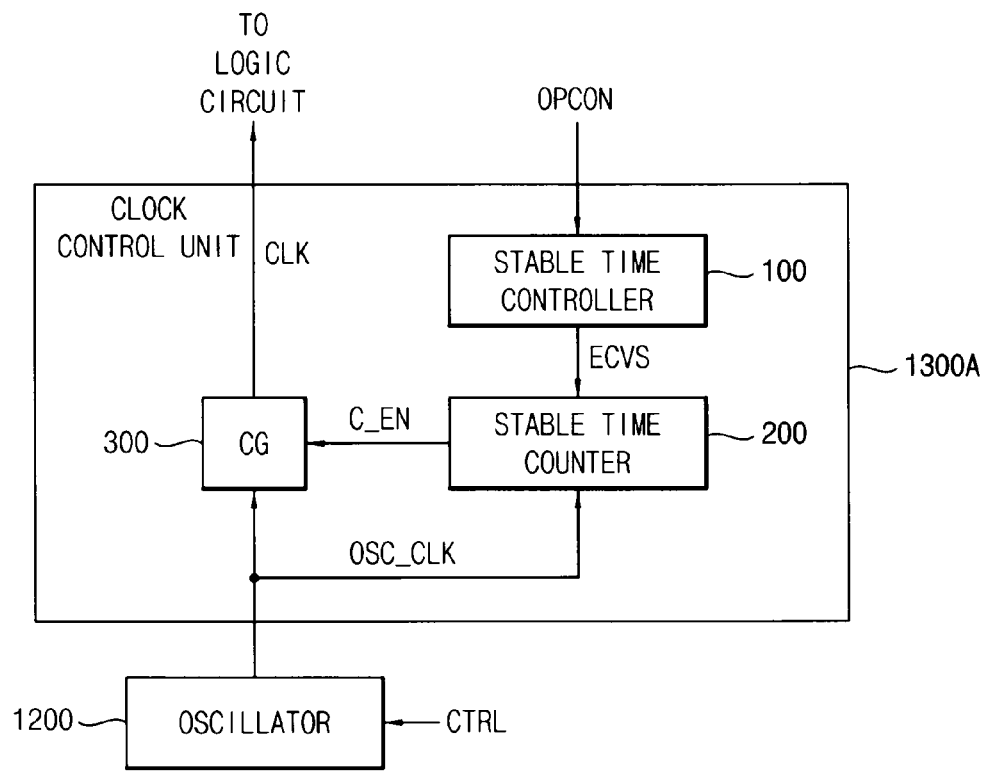
FIG. 2 is an exemplary embodiment of a clock control unit in FIG. 1.

FIG. 2 is an exemplary embodiment of a clock control unit in FIG. 1. A clock gating means function that shuts off the power supplied to unused components in a computer system. As all components or functions of the computer system are not running all the time, it is understood that power consumption can be reduced by stopping the unused components of a computer. Also heat generated from the unused components may also be reduced.

Referring to FIG. 2, a clock control unit 1300A may include a stable time controller 100, a stable time counter 200, and a clock gating cell 300.

The stable time controller 100 may generate an expiration counting value signal ECVS according to the OPCON. The OPCON may include at least one element from among process features for manufacturing a semiconductor device, an active mode voltage, or an active mode temperature, or may be determined by a combination of the elements. The ECVS contains an expiration counting value (ECV) which is used for setting stable time needed for supplying stable clock to a system by an oscillator during a wake-up operation that is changing from an inactive mode to an active mode.

The stable time counter 100 may begin a counting operation when the oscillator 1200 generates a clock oscillation operation and generate a clock gating signal (C_EN) by comparing a counting value and the ECV.

The clock gating cell 300 receives an oscillation clock (OSC_CLK) from the oscillator 1200 and receives the C_EN from the stable time counter 200. The clock gate cell 300 may supply or block a CLK to the logic circuit 1400 in response to the C_EN. For example, in case of the OSC_CLK is weak or unstable, the logic circuit 1400 does not receive the CLK because the clock gating cell 300 is disabled. But at the point of a counting value set in the stable time counter 200 reaches an ECVS set by a stable time counter 100, the C_EN is activated. The clock gate cell 300 may supply a CLK to the logic circuit 1400 in response to the activated C_EN.

Figure 3:
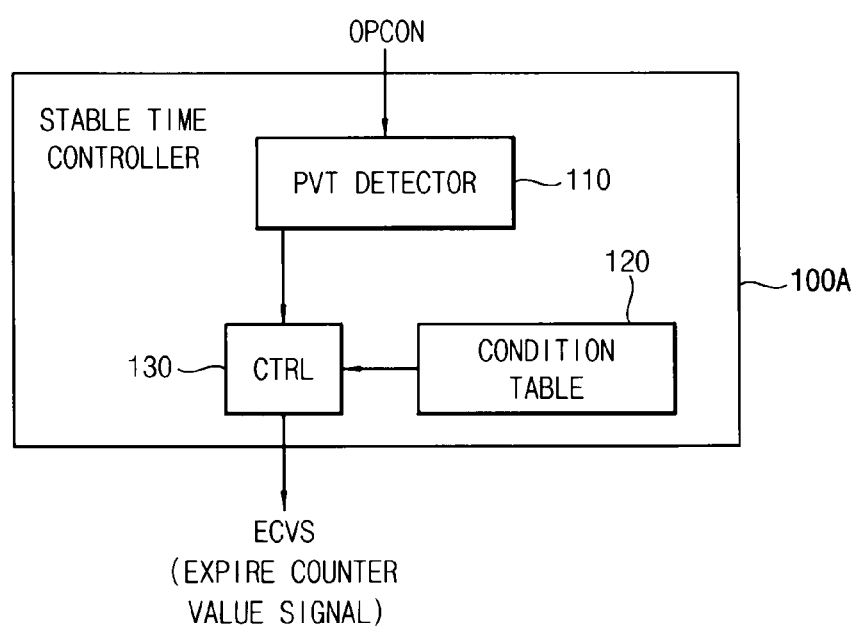
FIG. 3 is an exemplary embodiment of a stable time controller in FIG. 2.

FIG. 3 is an exemplary embodiment of a stable time controller in FIG. 2. The stable time controller 100A may operate independently with the logic circuit 1400. Accordingly, regardless of the situation in which power is off in an active mode, the stable time controller 100A may receive active mode information such as an active mode voltage and an active mode temperature, and set an ECVS corresponding to an OPCON.

Referring to FIG. 3, the stable time controller 100A may include a power/voltage/temperature (PVT) detector 110, a condition table 120, and a controller 130. The PVT detector 110 may receive an OPCON. The OPCON may one of an active mode voltage or and an active mode temperature. As a unique process characteristic arose from a semiconductor manufacturing process is determined by an initial setting value, it is not necessary to measure such a unique process characteristic on a regular basis.

The conditional table 120 may store a table which shows a relationship between and an OPCON and a stable time. Generally, a stable time of an operation within a normal operation range tends to be less than a stable time of an operation outside of a normal operation range. In the normal operation, an operation power is supplied well in an ordinary temperature and the normal operation range can be set to devices differently. In an operation outside of a normal operation, an active mode temperature is high or less than an ordinary temperature or an active mode voltage is high or less than a standard voltage. Furthermore, subject to a characteristic of a semiconductor manufacturing process, a fast-fast corner (FF), a fast-slow corner (FS), and a typical-typical corner (TT) can be categorized into a normal operation range, yet a slow-fast corner (SF) and slow-slow corner (SS) can be categorized as being outside of a normal operation range.

It is understood that a normal operation range can be set differently by a person in this field. Additionally, a value of the condition table 120 can be changed by an oscillator circuit and a characteristic of a semiconductor manufacturing process. In this case, the value of the condition table 120 can be set by programming or be stored in a Static Random Access Memory (SRAM).

The controller 130 may receive a current active mode condition from the PVT detector 110, extract a stable time corresponding to the current active mode condition from the condition table 120, and set an ECVS on a regular basis. The controller 130 may transmit the ECVS to the stable time counter 200.

Figure 4:
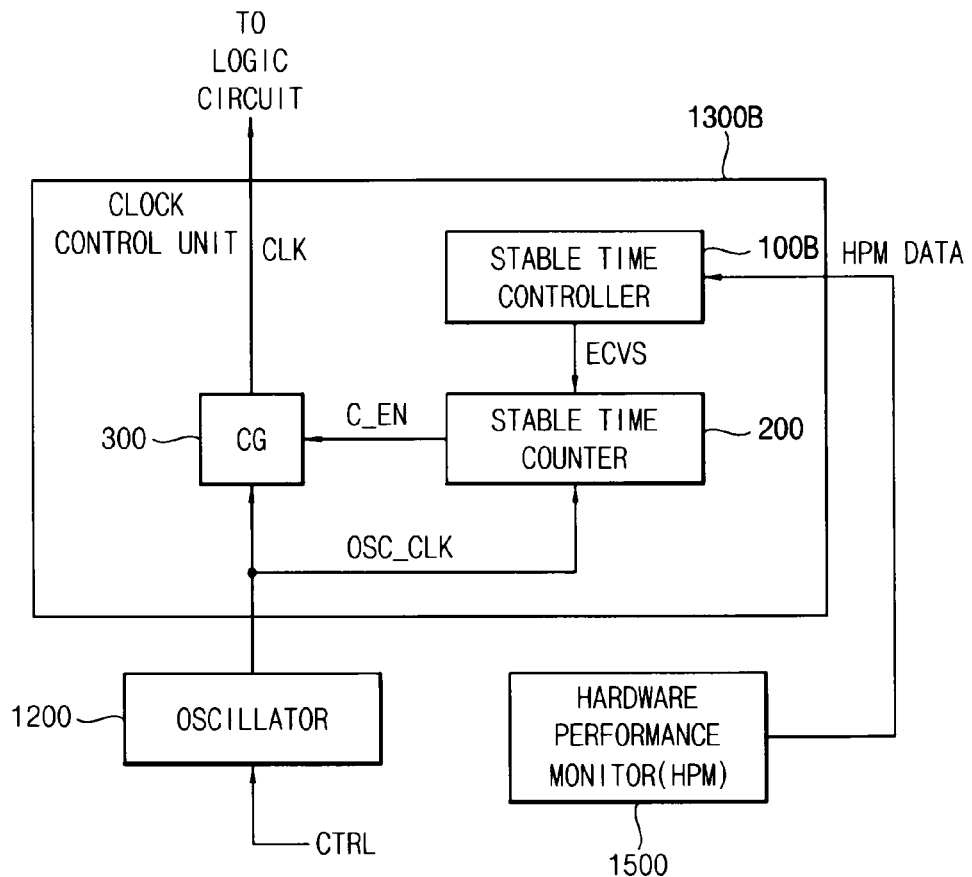
FIG. 4 is another exemplary embodiment of a clock control unit in FIG. 1.
Figure 5:
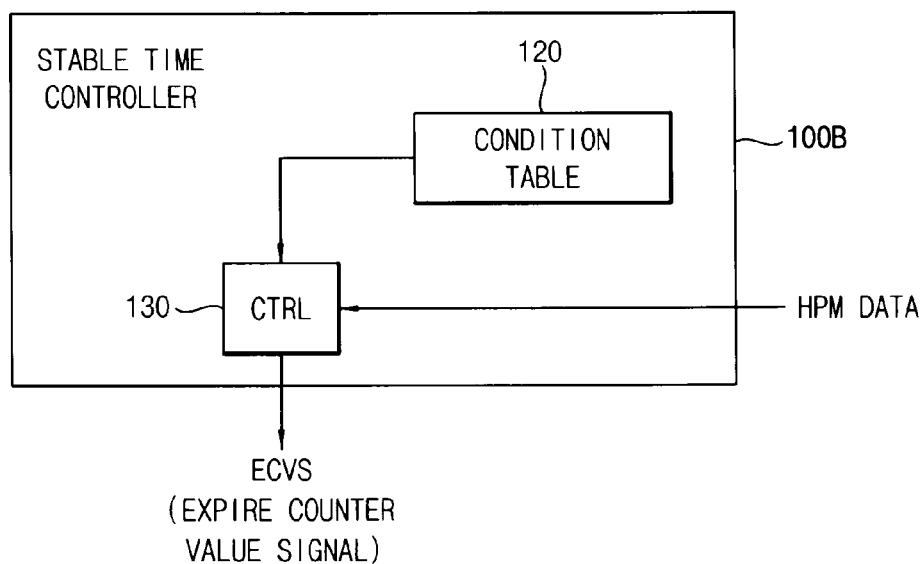
FIG. 5 is an exemplary embodiment of a stable time controller in FIG. 4.

FIGS. 4 and 5 another exemplary embodiment of the clock control unit 1300 in FIG. 1 and a stable time controller 100B. Generally, a hardware performance monitor 1500 may monitor a computer hardware operation condition. The hardware performance monitor may sense an electrical signal received from the system to be monitored and calculate an average instruction execution time, a frequency of appearance of instructions, an equipment usage rate, etc. The hardware performance monitor 1500 may monitor such data while a computer system runs.

Referring to FIG. 4 and FIG. 5, as the hardware performance monitor 1500 is located close to the oscillator 1200 to monitors a condition of the oscillator 1200, the hardware performance monitor 1500 may monitor a condition of a hardware on a periodic basis.

The stable time controller 100B may include the condition table 120 and the controller 130. The hardware performance data monitored by the hardware performance monitor 1500 can be transmitted to the controller 130 in the stable time controller.

The condition table 120 may store a relationship between hardware performance data (HPM data) and a stable time. The controller 130 may receive the HPM data, extract a stable time corresponding to the HPM, and set an ECVS on a regular basis. In this case, as the stable time controller 100B may monitor the operation condition of a processor through the hardware performance monitor 1500, the stable time controller 100B may not need the stable time controller 100 in FIG. 2 and the PVT detector in FIG. 3.

Figure 6:
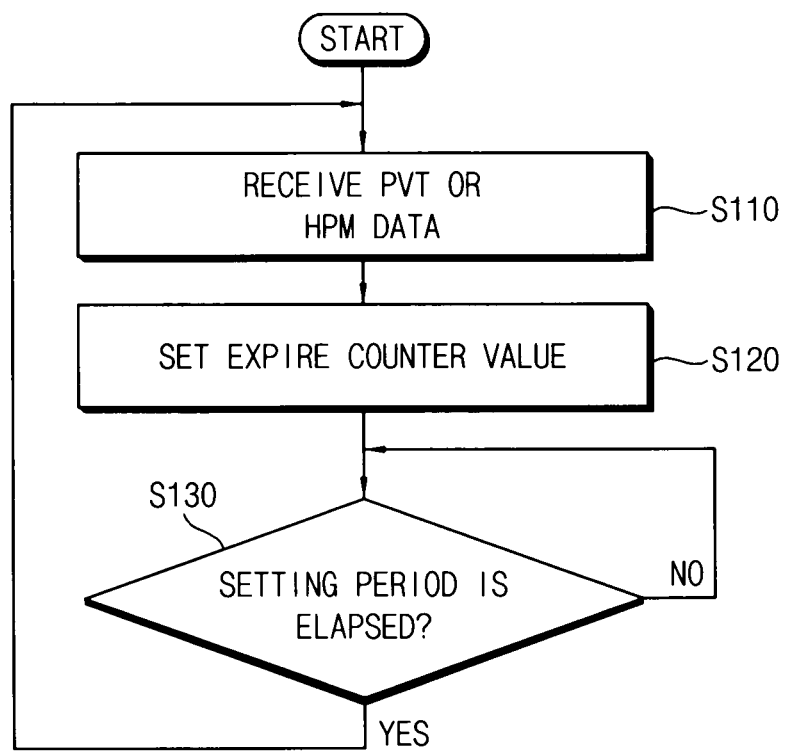
FIG. 6 is a flowchart illustrating an operation of setting an expiration counting value signal (ECVS) in a stable time controller according to an aspect of an exemplary embodiment.

FIG. 6 is a flowchart illustrating an operation of setting an ECVS in a stable time controller according to an exemplary embodiment. Referring to FIGS. 3, 5, and 6, the stable time controller 100 may receive at least one element from among process features for manufacturing a semiconductor device, an operation voltage, or an operation temperature or receive HPM data from the hardware performance monitor 1500 (S110). The elements may be received by the controller on a periodic basis. The stable time controller 100 may set an ECVS based on a current operation condition stored in the condition table 120 (S120). As the ECVS may be set on a periodic basis, operation of setting an ECVS in a stable time controller may return to the first step S110 after a certain period has passed (S130).

Figure 7:
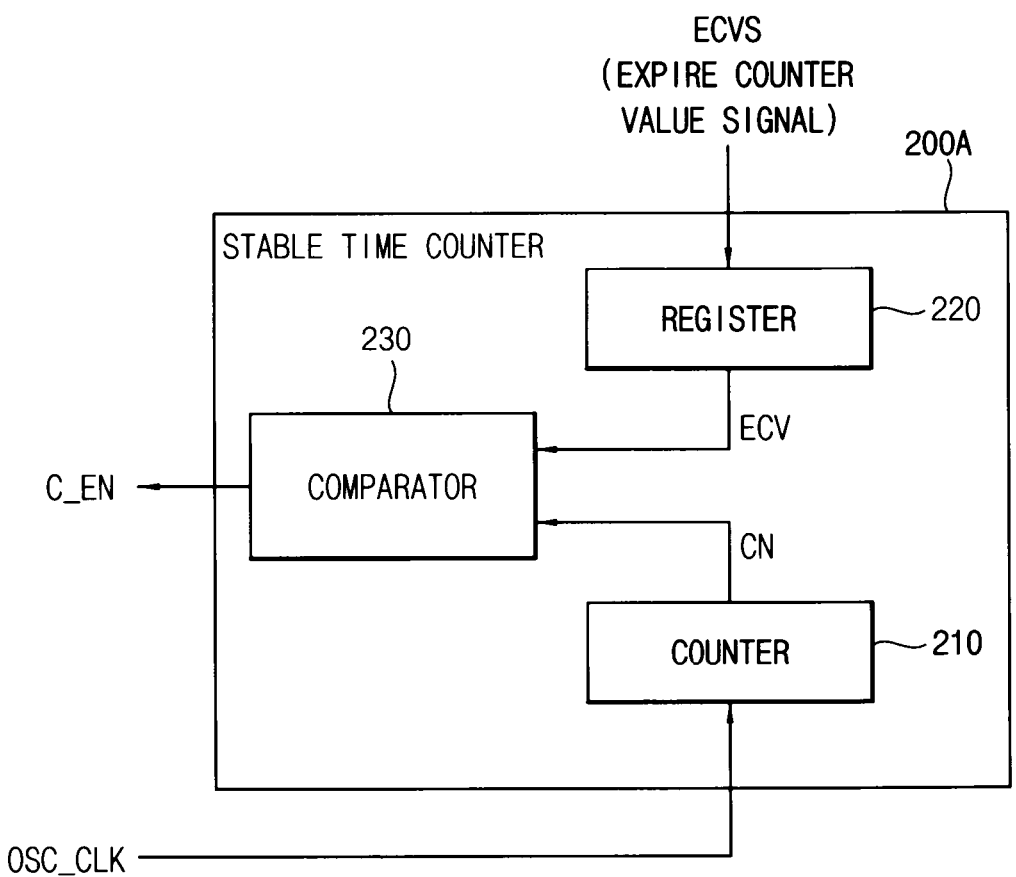
FIG. 7 is a block diagram of another exemplary embodiment of a stable time counter in FIG. 2 and FIG. 4.

FIG. 7 is a block diagram of another exemplary embodiment of a stable time counter in FIG. 2 and FIG. 4. A stable time counter 200A may count clocks in response to an unstable oscillator clock (OSC_CLK) generated by an oscillator and activate a clock gating signal (C_EN) after a stable time has elapsed.

Referring to FIG. 7, the stable time counter 200A may include a counter 210, a register 220, and a comparator 230. The counter 210 may count clock periods in response to an unstable oscillator clock (OSC_CLK). The register 220 may temporarily store an ECVS generated by the stable time controller 100. The register 220 may be omitted. The comparator 230 may compare a counting number (CN) generated by the counter 210 and an expiration counting value (ECV) stored in the register 230. The comparator 230 activates a C_EN based on a result of a comparison. For example, the comparator 230 may activates C_EN when the expiration counting value stored in the register and the counting number generated by the counter are equal.

FIG. 8 is a table illustrating a stable counting signal, a counting value, and a clock gating signal in a stable time counter in FIG. 7. According to another exemplary embodiment, a number of data bits of an ECV and a number of data bits of a CN can be same. In this case, a C_EN may be activated when a CN reaches an ECV.

According to another exemplary embodiment, a number of data bits of an ECV may be less than a number of data bits of a CN. In this case, a C_EN may be activated when a CN reaches an ECV. Referring to FIG. 8, the comparator 230 may compare only first 4 most significant bits of 16 bits of a CN with an ECV. For example, in case of where the ECV is "001", the comparator 230 may activate a C_EN only by comparing the first 4 most significant bits "0001" out of "0001 0000 0000 0000" of a CN. This method may compare quickly and reduce a complexity of circuits.

Figure 9:
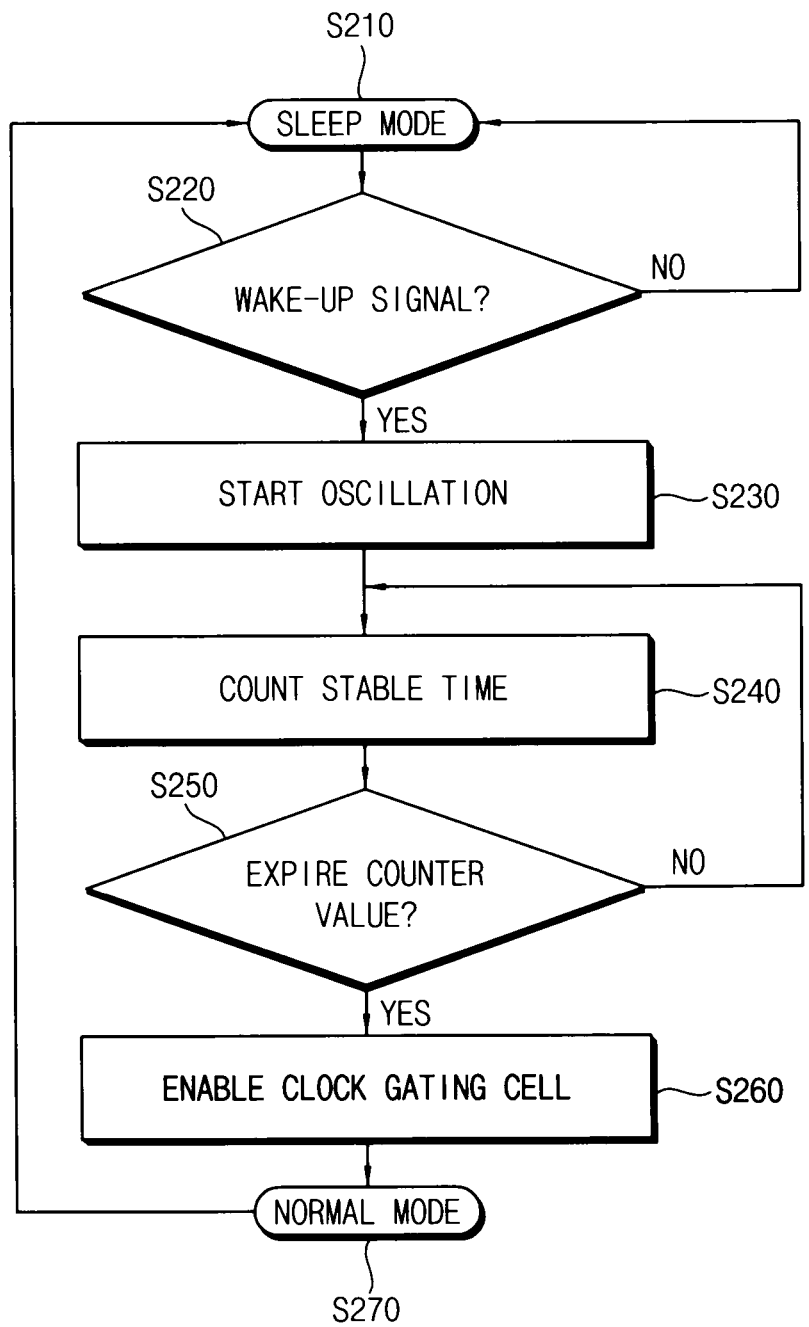
FIG. 9 is a flowchart illustrating an enable operation of a clock gating cell when a wake-up signal is inputted in an inactive mode according to an exemplary embodiment.

FIG. 9 is a flowchart of an enable operation of a clock gating cell when a wake-up signal is inputted in an inactive mode according to an exemplary embodiment. Referring to FIGS. 1, 2, and 9, the semiconductor device 1000 may enter into an inactive mode to save a power when the semiconductor device 100 is not active for a certain period (S210). In an inactive mode, the PMU 1100 may transmit a power control signal (CTRL) in response to a wake-up signal (S220). The oscillator 1200 may generate a certain frequency and supply an active mode clock to the logic circuit 1400 in response to the CTRL (S230). The counter 210 in the stable time counter 200 may count clocks in response to an unstable oscillator clock (OSC_CLK) (S240). The comparator 230 may compare a CN generated by the counter 210 and an ECV stored in the register 230 (S250). A C_EN may be activated when the CN reaches the ECVS. And the clock gating cell may be enabled in response to the activated C_EN and a CLK is transmitted to the logic circuit 1400 (S260). The semiconductor device 1000 may enter into an active mode when the logic circuit 1400 receives the CLK (S270).

Figure 10:
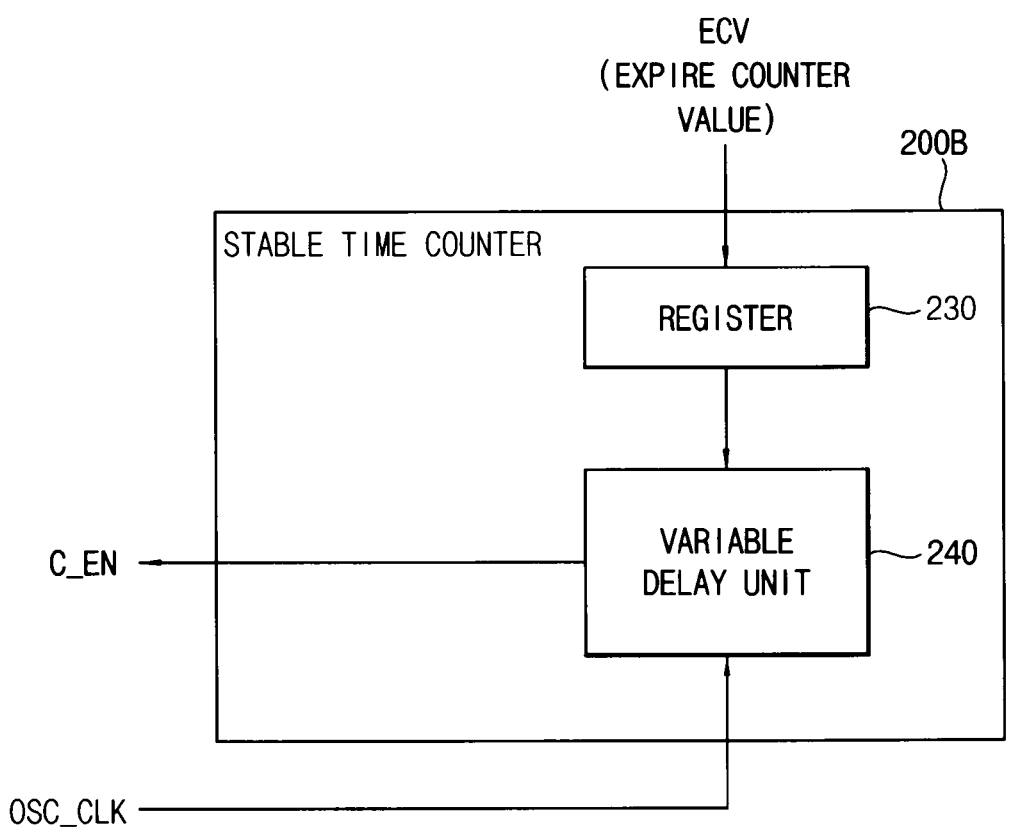
FIG. 10 is a block diagram of an exemplary embodiment of a stable time counter in FIG. 2 and FIG. 4.

FIG. 10 is a block diagram of an exemplary embodiment of a stable time counter in FIG. 2 and FIG. 4. The stable time counter 200B may include a register 230 and a variable delay unit 240. The register 230 may store an ECVS supplied by the stable time controller 100 temporarily. The variable delay unit 240 may delay an input for a certain period. The variable delay unit 240 may control a timing of the C_EN's activation by delaying the timing of the activation in response to an ECVS.

Figure 11:
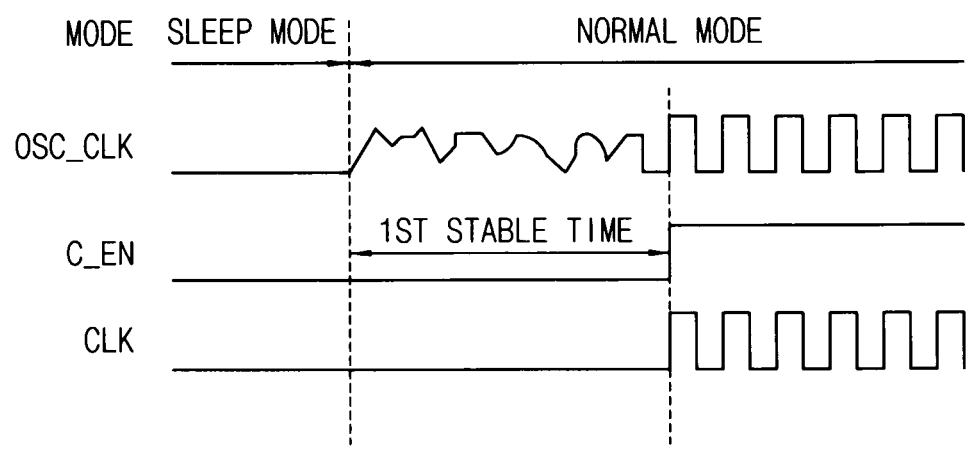
FIG. 11 is a timing diagram of signals generated by a semiconductor device according to an operation condition according to an exemplary embodiment.

FIG. 11 is a timing diagram of signals generated by a semiconductor device according to an operation condition. Referring to FIGS. 1, 2, 11 and 11, when a user activates a semiconductor device or a background operation is needed, the semiconductor device may enter into an active mode in response to a wake-up signal. In this case, as the oscillator 1200 may also receive power, the oscillator 1200 may generate an OSC_CLK. But as the OSC_CLK may be unstable from the first beginning, a C_EN may be activated after a stable time has passed. The clock gating may be enabled by receiving the C_EN and may transmit a CLK to the logic circuit 1400.

Figure 12:
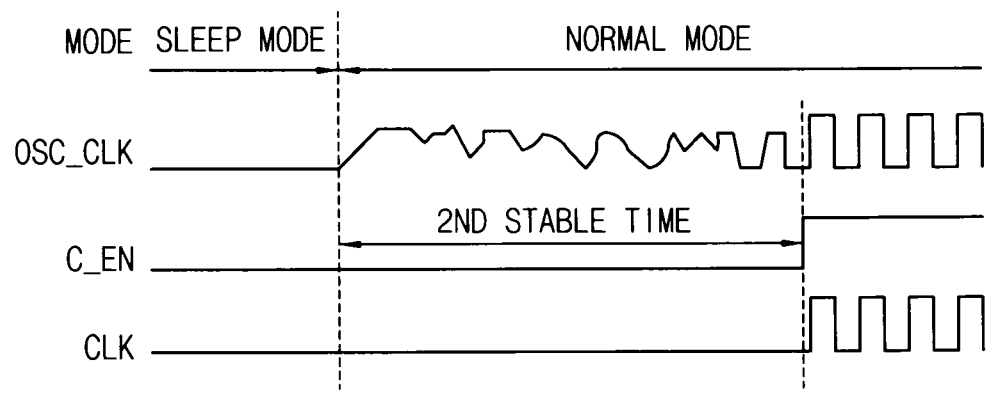
FIG. 12 is a timing diagram of signals generated by a semiconductor device according to an operation condition according to another exemplary embodiment.

FIG. 11 is a timing diagram of signals generated by a semiconductor device when an operation condition is within a normal operation range. FIG. 12 is a timing diagram when an operation condition is outside of a normal operation range. Referring to FIG. 11 and FIG. 12, a stable time of an operation within the normal operation range tends to be less than a stable time of an operation outside of the normal operation range. Accordingly, the stable time controller 100 may set an ECV easily.

Figure 13:
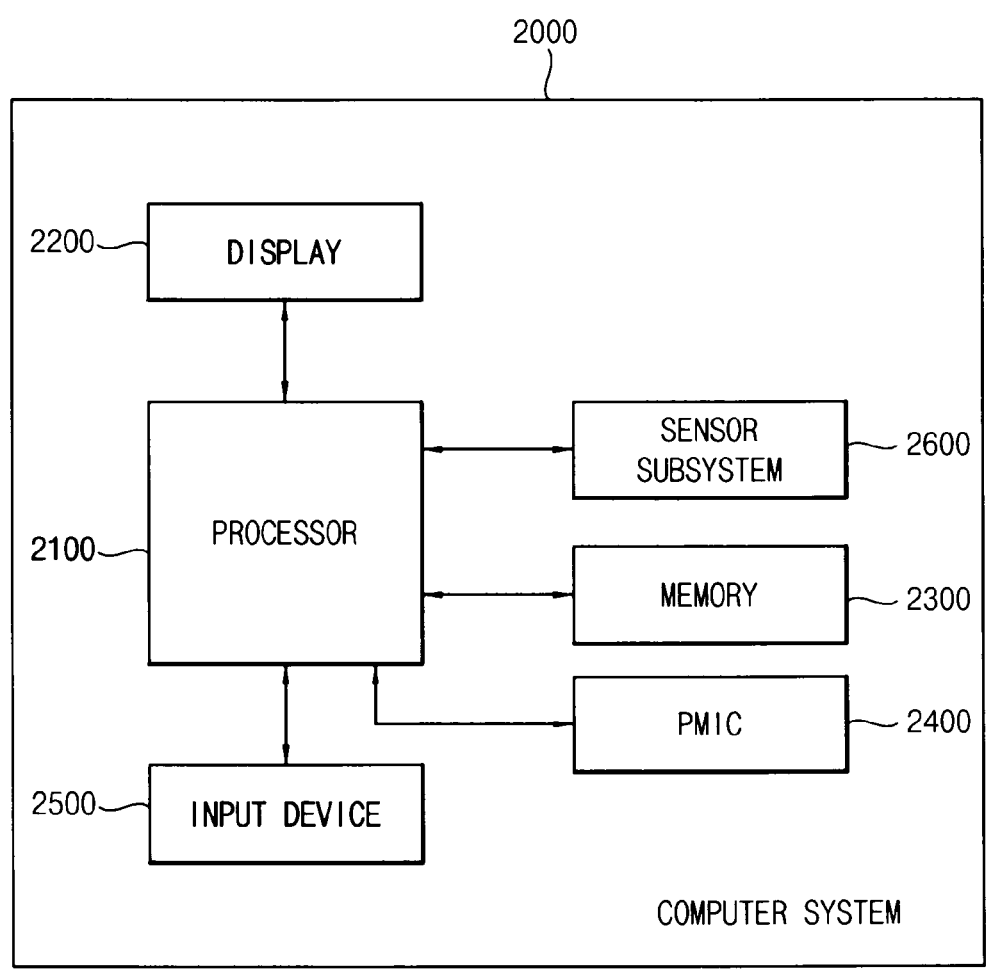
FIG. 13 is a computer system that includes a semiconductor device according to an exemplary embodiment.

FIG. 13 is a computer system 2000 that includes a semiconductor device according to an exemplary embodiment. Referring to FIG. 13, the computer system 2000 can be a personal computer (PC), a network server, a tablet PC, a net-book, an e-reader, a personal digital assistant (PDA), a portable multimedia player (PMP), a MP3, or a MP4 player.

The computer system 2000 may include a processor 2100, a display 2200. a memory 2300, a power management controller (PMIC) which supplies power to the processor 2100, a input device 2500, and sensor subsystem 2600.

The processor 2100 may include a semiconductor device according to an aspect of an exemplary embodiment. The processor 2100 may display a data stored in the memory 2300 according to an instruction received from the input device 2500. For example, the input device 2500 can be a touch pad, a computer mouse, a keypad, a keyboard, etc. The processor 2100 may control the overall operation of the computer system 2000.

The PMIC 2400 may supply power to the processor 2100. In the case when the processor 2100 is in an inactive mode, the PMIC 2400 may supply power to only components which are needed for an essential operation of the processor 2100 such as a real time clock operation and shut off power to other components In this case, when the wakeup signal is received, the processor turns to an active mode and the power may be supplied to all the components.

The sensor subsystem 2600 may monitor a surrounding condition on a certain regular cycle (e.g., few Hz~hundreds of Hz) even in an inactive mode. In this case, the sensor subsystem may run with low power and measure an active mode temperature and an active mode power on a real time basis. Furthermore, the sensor subsystem may send data to or receive data from the processor 2100 through a channel.

Figure 14:
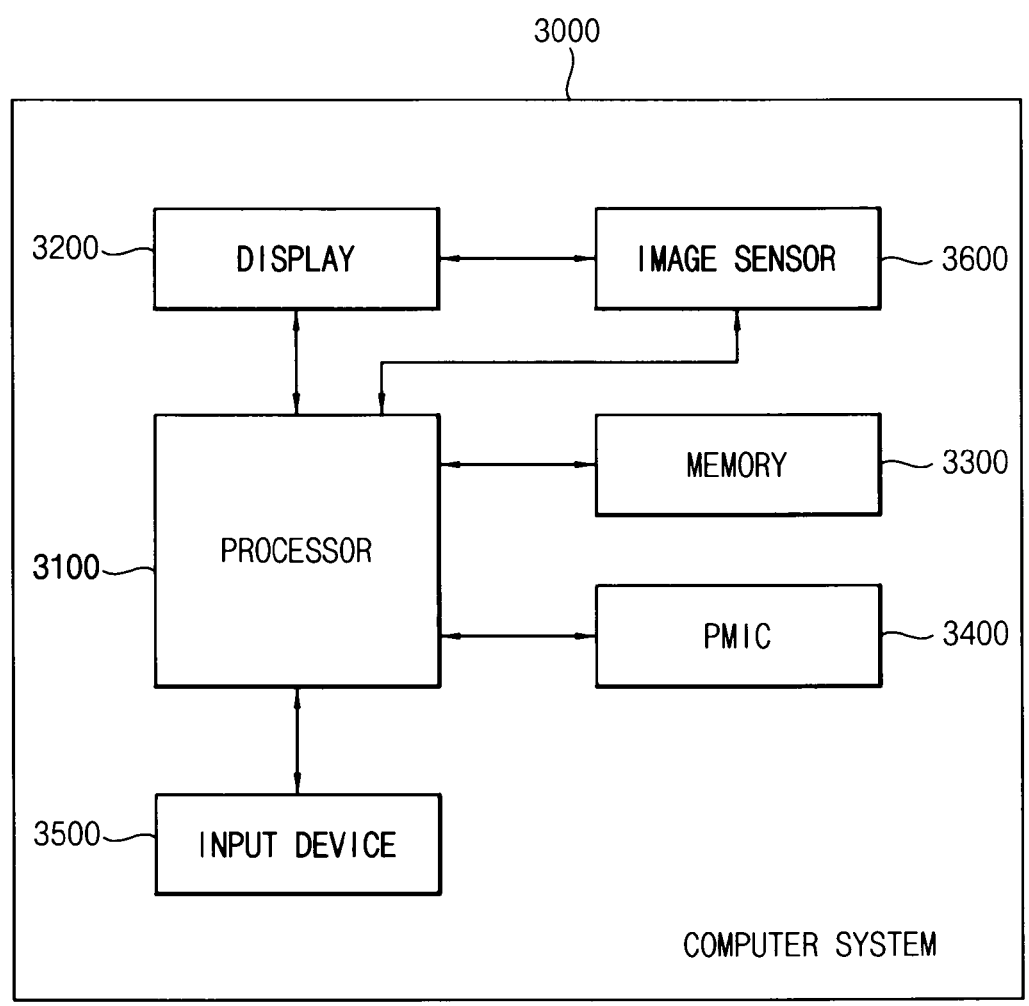
FIG. 14 is a computer system that includes a semiconductor device according to another exemplary embodiment.

FIG. 14 is a computer system 3000 that includes a semiconductor device according to another exemplary embodiment. Referring to FIG. 14, the computer system 3000 can be an image processor device such as a digital camera, or a mobile device with a digital camera on.

The computer system 3000 may include a processor 3100, a display 3200, a memory 3300, a processor 3100, a PMIC 3400 which supplies power to the processor 3100, and a input device 3500. Accordingly, the computer system 3000 may further include an image sensor 3600.

The image sensor 3600 may convert an optical image to a digital signal, and the converted digital signal may be sent to the processor 3100 or the memory 3300. In this case, the processor 3100 may include a semiconductor device according to an aspect of an exemplary embodiment. The converted digital signal may be displayed on the display 3200 or be stored in the memory 3300 under a control of the processor 3100. Furthermore, the data stored in the memory 3300 can be displayed on the display 3200 under a control of the processor 3100.

The PMIC 3400 may supply power to the processor 3100. If the processor 3100 is in an inactive mode, the PMIC 3400 may supply power to only components which are needed for an essential operation of the processor 3100 such as a real time clock operation and shut off power to other components. In this case, when the wakeup signal is received, the processor turns to an active mode and the power may be supplied to the all the components.

Figure 15:
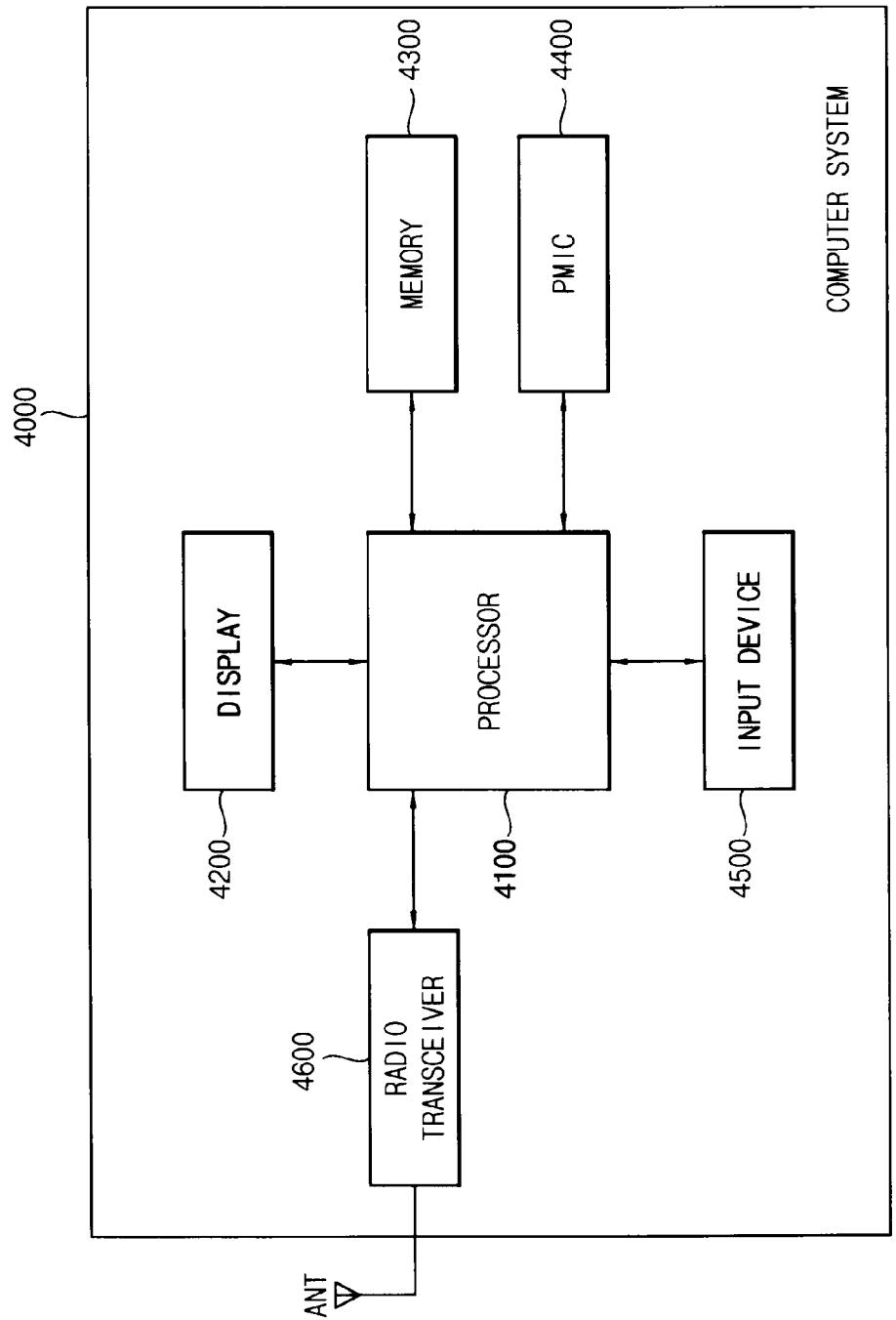
FIG. 15 is a computer system that includes a semiconductor device according to another exemplary embodiment.

FIG. 15 is a computer system that includes a semiconductor device 4000 according to another exemplary embodiment. Referring to FIG. 15, the computer system 4000 can be a cellular phone, a smart phone, a personal digital assistant, a smart pad or a mobile communication device. The smart pad may include a tablet personal computer.

The computer system 4000 may include a processor 4100, a display 4200, a memory 4300, a processor 4100, a PMIC 4400, and an input device 4500.

A radio transceiver 4600 may transmit or receive wireless signal through an antenna (ANT). For example, the radio transceiver 4600 may convert signals received through the ANT to the signals that the processor 4100 can execute. Accordingly, the processor 4100 may execute the signals received from the radio transceiver 4600 and transmit the executed signals to the memory 4300 or the display 4200.

Furthermore, the radio transceiver 4600 may convert the signals received from the processor 4100 to a wireless signals and transmit the wireless signals to an external devices through the ANT.

The input device 4500 can be a touch pad, a computer mouse, and a keypad, or a keyboard. The input device is a device that allows a user to input signals to control the processor 4100 or to input data to be executed by the processor 4100.

The processor 4100 may include a semiconductor device according to an aspect of an exemplary embodiment. The converted digital signal may be displayed on the display 4200 or be stored in the memory 4300 under a control of the processor 4100. Furthermore, the data stored in the memory 4300 can be displayed on the display 4200 under a control of the processor 4100.

The PMIC 4400 may supply power to the processor 4100. If the processor 4100 is in an inactive mode, the PMIC 4400 may supply power to only components which are needed for an essential operation of the processor 4100 such as a real time clock operation and shut off power to other components. In this case, when the wakeup signal is received, the processor turns to an active mode and the power may be supplied to all the components The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A clock control device comprising:
   a stable time controller which receives an operational condition and generates an expiration counting value based on the operational condition;
   a stable time counter which receives the expiration counting value and activates a clock gating enable signal after a count value of the stable time counter is equal to the expiration counting value;
   a clock gating cell which transmits a clock signal after receiving the clock gating enable signal; and
   an oscillator which generates an oscillator clock signal and transmits the oscillator clock signal to the clock gating cell and the stable time counter,
   wherein the stable time controller comprises:
      a condition table which stores a plurality of stable times that correspond to a plurality of operational conditions; and
      a controller which receives the operational condition and determines a stable time corresponding to the received operational condition from among the plurality of stable times stored in the condition table and generates the expiration counting value that corresponds to the determined stable time, and
   wherein the operational condition is least one from among process features for manufacturing a semiconductor device, a voltage, or a temperature.

2. The clock control device of claim 1, wherein the oscillator generates the oscillator clock signal in response to receiving a power control signal.

3. The clock control device of claim 2, wherein the clock signal and the oscillator clock signal are same when the stable time counter receives the clock gating enable signal.

4. The clock control device of claim 2, wherein the stable time counter counts the count value when the stable time counter receives the oscillator clock signal.

5. The clock control device of claim 1, further comprising:
   a hardware performance monitor which monitors an environment of the oscillator, generates the operational condition based on the environment of the oscillator and transmits the operational condition to the stable time controller.

6. The clock control device of claim 5, wherein the hardware performance monitor generates the operational condition by calculating at least one from among an average instruction execution time, a frequency of appearance of instructions, and an equipment usage rate of a system containing the oscillator.

7. The clock control device of claim 5, wherein the controller determines a stable time corresponding to the operational condition received from the hardware performance monitor from among the plurality of stable times in the condition table and generates the expiration counting value that corresponds to the determined stable time.

8. The clock control device of claim 1, wherein the stable time counter comprises:
a register which stores the expiration counting value received from the stable time controller;
a counter which generates the count value based on clock periods of the oscillator clock signal; and
a comparator which compares the count value and the expiration counting value and activates the clock gating enable signal based on the comparison.

9. The clock control device of claim 1, wherein the stable time counter comprises:
a register which stores the expiration counting value received from the stable time controller; and
a variable delay device which receives the oscillator clock signal and delays the activation of the clock gating enable signal for a predetermined number of clock periods of the oscillator clock signal based on the expiration counting value.

10. A semiconductor device comprising:
the clock control device of claim 1;
a logic circuit which receives the clock signal from the clock control device; and
a power management unit which controls power supply of the semiconductor device.

11. The semiconductor device of claim 10, wherein the oscillator generates the oscillator clock signal in response to receiving a power control signal from the power management unit, and wherein the stable time counter counts the count value when the stable time counter receives the oscillator clock signal from the oscillator.

12. The semiconductor device of claim 10, further comprising:
a hardware performance monitor which monitors an environment of the oscillator, generates the operational condition based on the environment of the oscillator and transmits the operational condition to the stable time controller.

13. A clock control method comprising:
storing, in a condition table, a plurality of stable times that correspond to a plurality of operational conditions;
receiving a wake-up signal and an operational condition;
generating an oscillator clock signal after receiving the wake-up signal; determining a stable time of the oscillator clock signal from among the plurality of stable times stored in the condition table based on the operational condition and generating an expiration counting value that corresponds to the determined stable time; and
activating a clock gating enable signal to supply the oscillator clock signal when the stable time is reached after a count value of a stable time counter is equal to the expiration counting value,
wherein the oscillator clock signal is stable when the stable time is reached, and
wherein the operational condition is least one from among process features for manufacturing a semiconductor device, a voltage, or a temperature.

14. The clock control method of claim 13, wherein the stable time is a clock count number and wherein activating a clock gating enable signal comprises:
comparing the stable time to a counting number based clock periods of the oscillator clock signal; and
activating the clock gating enable signal based on the comparison.

15. The clock control method of claim 13, wherein the activating the clock gating enable signal comprises:
delaying the activating of the clock gating enable signal for a predetermined number of clock periods of the oscillator clock signal based on the stable time.

* * * * *